(12) United States Patent
Tailliet

(10) Patent No.: US 10,497,449 B2
(45) Date of Patent: Dec. 3, 2019

(54) APPARATUS AND PROCESS FOR CONTROLLING SENSE CURRENT IN A NON-VOLATILE MEMORY

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/043,218

(22) Filed: Jul. 24, 2018

(65) Prior Publication Data
US 2019/0057748 A1 Feb. 21, 2019

(30) Foreign Application Priority Data
Aug. 17, 2017 (FR) ..................................... 17 57718

(51) Int. Cl.
| | |
|---|---|
| *G11C 16/06* | (2006.01) |
| *G11C 16/28* | (2006.01) |
| *G11C 16/24* | (2006.01) |
| *G11C 16/30* | (2006.01) |
| *G11C 16/04* | (2006.01) |
| *G11C 7/14* | (2006.01) |
| *G11C 13/00* | (2006.01) |

(52) U.S. Cl.
CPC ............... *G11C 16/28* (2013.01); *G11C 7/14* (2013.01); *G11C 13/004* (2013.01); *G11C 16/0433* (2013.01); *G11C 16/24* (2013.01); *G11C 16/30* (2013.01); *G11C 2013/0045* (2013.01); *G11C 2013/0054* (2013.01); *G11C 2207/063* (2013.01)

(58) Field of Classification Search
CPC ......... G11C 16/08; G11C 16/10; G11C 16/28; G11C 16/30; G11C 16/32; G11C 2207/2227; G11C 29/14; G11C 5/14; G11C 8/10; G11C 11/16; G11C 17/14; G11C 17/146; G11C 2029/1204; G11C 2029/4402; G11C 29/021; G11C 29/023; G11C 29/028; G11C 7/20; G11C 8/08; G11C 2216/10; G11C 13/0007; G11C 13/004; G11C 13/0069; G11C 16/0441; G11C 16/3468; G11C 16/3486; G11C 2013/0045; G11C 2013/0083; G11C 2213/72; G11C 29/50008
USPC ............................... 365/158, 189.15, 189.16
See application file for complete search history.

(56) References Cited

U.S. PATENT DOCUMENTS 5,986,940 A * 11/1999 Atsumi .................. G11C 16/28
365/185.3
9,384,850 B2 7/2016 Barsilai
(Continued)

*Primary Examiner* — Thong Q Le
(74) *Attorney, Agent, or Firm* — Slater Matsil, LLP

(57) ABSTRACT

In an embodiment, a method is provided for controlling a level of a read current in a non-volatile memory that is powered by a supply voltage includes. A model current representative of an actual current able to flow during a readout through a read path of the memory is determined based on the value of the supply voltage. The model current is compared to a reference current having a reference value. A control signal is generated. The control signal is to control the generation of the read current having a level equal to the lowest value between a fraction of the value of the model current and the reference value.

25 Claims, 3 Drawing Sheets

(56) References Cited

U.S. PATENT DOCUMENTS

| | | |
|---|---|---|
| 9,761,316 B2 | 9/2017 | Tailliet et al. |
| 2010/0124125 A1 | 5/2010 | Amanai et al. |
| 2011/0096587 A1 | 4/2011 | Kim et al. |

* cited by examiner

US 10,497,449 B2

APPARATUS AND PROCESS FOR CONTROLLING SENSE CURRENT IN A NON-VOLATILE MEMORY

CROSS-REFERENCE TO RELATED APPLICATIONS

This application claims priority to French Patent Application No. 1757718, filed on Aug. 17, 2017, which application is hereby incorporated herein by reference.

TECHNICAL FIELD

The present invention relates generally to electronic circuits, and, in particular embodiments, to an apparatus and process for controlling sense current in a non-volatile memory.

BACKGROUND

Advanced non-volatile memory technologies, in particular electrically erasable and programmable non-volatile memories (EEPROMs), may be required to be able to operate with a wide range of supply voltages.

Specifically, EEPROM memories communicating, for example, over a Serial Peripheral Interface bus (SPI) or an Inter-Integrated Circuit ($I^2C$) type series data bus may be required to be compatible with supply voltages varying from 1.6 V to 5.5 V.

The transfer frequency of data over such a bus is related to the value of the supply voltage. Typically, this frequency is 5 MHz for a voltage of 1.6 V and 20 MHz for a voltage of 4.5 V or more.

Yet, data stored in the memory cells of an EEPROM memory are conventionally read by read amplifiers and using methods that are, in particular, influenced by the value of the supply voltage.

A read amplifier converts a measurement of the charge of a memory cell into a digital signal, generally in a voltage-based read mode or in a current-based read mode.

In the voltage-based read mode a constant read current is injected into a bit line, and the resulting voltage on the bit line is compared to a reference voltage.

The read current is well-controlled, because it is injected by the read amplifier.

However, this voltage-based read mode is not recommended when rapid access is required, because of substantial parasitic capacitive coupling between adjacent bit lines.

In the current-based read mode, the bit line is placed at a pre-charge voltage, and the resulting current flowing through the bit line is compared to a reference read current.

This read mode allows a rapid readout, without the drawback of capacitive coupling between bit lines.

However, the current flowing through the bit line is less well-controlled—it may be high if the supply voltage is at a high level and the memory cell highly programmed.

Thus, for a rapid access time at a high supply-voltage level, the reference read current must be sufficiently high.

In general, it is a question of a current that is stable with respect, for example, to the supply voltage and temperature, and originating from a dedicated current source.

At low supply-voltage levels (for example 1.6 V), metal-oxide-semiconductor (MOS) transistors of the read path connecting the memory cell read to the read amplifier are more resistive and pass less current.

These MOS transistors, for example, belong to read-multiplexing and memory-location-decoding devices and generally are used as very resistive, low-control-voltage switches.

Therefore, there is a risk that the current passed by the read path in series with a programmed cell will be lower than the injected read current (in the voltage-based read mode) or than the compared read current (in the current-based read mode).

A programmed cell may thus be read as erased, at low supply-voltage levels.

Conventional solutions consisting in decreasing the read current are limited in terms of access time at high supply-voltage levels. At a low supply-voltage level, indexing the read current lower has the drawback of possibly leading, by way of precaution, to a needlessly low current, resulting in a high access time.

SUMMARY

One or more embodiments are directed to controlling non-volatile-memory read amplifiers with a wide range of supply voltages.

One or more embodiments, improve reliability and access time.

In one or more embodiments, a device is provided for controlling the level of a read current of a non-volatile memory that is configured to be powered by a supply voltage. The device comprises a control circuit that is configured to: determine a value of a model current representative of an actual current able to flow during a readout through a read path of the memory, depending on the value of the supply voltage; compare the model current with a reference current having a reference value; and generate a control signal that is intended to control at least one read-current-generating circuit that is configured to generate, in the presence of the control signal, a read current with a value equal to the lowest value between a fraction of the value of the model current and the value of the reference current.

In other words, it is proposed to follow the actual limitation of a model current as a function of the supply voltage and to generate a read current depending on this limitation, and with a margin.

For example, the control circuit comprises a model circuit that is configured to pass the model current in a way that is controlled by a first voltage, for example called the gauge voltage, and a regulating circuit that is configured to generate the first voltage on the basis of the comparison of the model current and the reference current.

According to one embodiment, the regulating circuit is configured to generate a first voltage, equal to a voltage floor if the supply voltage is higher than or equal to the voltage floor and equal to the supply voltage if the supply voltage is lower than the voltage floor, the value of the voltage floor resulting from control of the flow of the model current to the reference value.

At low supply voltages, the read current is limited to a level that is as high as possible, relatively to the current actually passed by the model circuit, thus optimizing read access time. At high supply voltages, the read current is limited by the level of the voltage floor, to what is called a reference value.

Advantageously, the regulating circuit comprises at least one current mirror that is configured to extract, from an output node, a copy of the model current, and a reference-current generator that is configured to inject, into the output node, a current having the reference value, the first voltage being the resulting voltage on the output node.

The control signal that is intended to control at least one read-current-generating circuit may be a mirror control voltage present on the common gates of one of the at least one current mirror.

According to one embodiment in which the memory has memory cells each comprising an access transistor and a state transistor having a threshold voltage, the model circuit comprises at least one model memory cell of architecture homologous to the architecture of a memory cell of the memory, the model access transistor being configured to be controlled via its gate by the first voltage, and the model state transistor being configured to be turned on by a dedicated control voltage, close to its threshold voltage.

For example, the dedicated control voltage is close to the threshold voltage of the model state transistor in that it differs therefrom by no more than 0.2 V.

For example, the model state transistor may include a floating gate and a control gate that are electrically connected to each other, the dedicated control voltage thus being applied to the floating gate via a control-gate connection.

According to one embodiment, the model circuit includes at least one model decoding circuit comprising at least one model decoding switch of architecture homologous to the architecture of the decoding switches of the memory allowing a bit line to be electrically connected to a read input of a read amplifier, the at least one model decoding switch being configured to be controlled by the first voltage.

Advantageously, the at least one model decoding circuit and the at least one model memory cell are respectively connected in series, each series forming a model read path, all the model read paths being connected in parallel.

For example, in some embodiments, the fraction of the value of the model current is comprised between ¼ and 1/1 of the model current.

According to one embodiment, the read current is intended to be injected into a bit line of the memory for a voltage-based readout.

According to one embodiment, the read current is intended to be compared to a current flowing through a bit line of the memory for a current-based readout.

A memory, of the electrically erasable and programmable non-volatile memory type, is also proposed. This memory includes a read-current-generating device such as described above, and at least one read amplifier including a read-current-generating circuit, the read-current-generating device being configured to deliver the control signal to the at least one read amplifier.

According to another aspect, a method is proposed for controlling the level of a read current in a non-volatile memory that is powered by a supply voltage, comprising: determining a model current representative of an actual current able to flow during a readout through a read path of the memory, depending on the value of the supply voltage; comparing the model current and a reference current having a reference value; and generating a control signal controlling the generation of the read current having a level equal to the lowest value between a fraction of the value of the model current and the value of the reference current.

According to one implementation, the step of determining a value of a model current comprises passing the model current through a model circuit that is controlled by a first voltage that is generated on the basis of the comparison of the model current and the reference current.

According to one implementation, the first voltage is equal to a voltage floor if the supply voltage is higher than or equal to the voltage floor and equal to the supply voltage if the supply voltage is lower than the voltage floor, the value of the voltage floor resulting from control of the flow of the model current to the reference value.

Advantageously, the generation of the first voltage comprises copying the model current so as to extract, from an output node, the copied model current and injecting, into the output node, the reference current, where the first voltage is the resulting voltage on the output node.

According to one implementation, the model current is representative of an actual current able to flow during a readout through a read path of the memory including a memory cell equipped with an access transistor that is controlled by the supply voltage, and a state transistor having a threshold voltage that is turned on by a dedicated control voltage close to its threshold voltage.

For example, in some embodiments, the dedicated control voltage is close to the threshold voltage of the state transistor in that it differs therefrom by no more than 0.2 V.

For example, in some embodiments, the dedicated control voltage may be applied to a floating gate of the state transistor.

According to one implementation, the model current is representative of an actual current able to flow during a readout through a read path of the memory including at least one decoding switch that is controlled by the supply voltage.

For example, in some embodiments, the fraction of the value of the model current is comprised between ¼ and 1/1 of the model current.

During a readout, the read current may be injected into a bit line of the memory for a voltage-based readout.

During a readout, the read current may be compared to a current flowing through a bit line of the memory for a current-based readout.

These various embodiments and implementations allow a correct read operation at low supply voltages, without compromising the access time and while optimizing power consumption at high voltages.

Specifically, the operating mode at low supply voltages decreases the read current to a fraction of that passed by a poorly programmed replica memory cell. Thus, programmed memory cells of the memory will be correctly read without risk.

The operating mode at high supply-voltage levels delivers a stable read current that does not increase with the supply voltage, allowing a rapid access time and a well-controlled read power consumption.

Thus, the readout is able to cope with a wide range of supply voltages, has a rapid access time and a low power consumption at high supply-voltage levels (for example suitable for communication over an SPI bus at 20 MHz), and furthermore can have a very good reliability and can have optimal power consumption at low supply voltage levels.

BRIEF DESCRIPTION OF THE DRAWINGS

Other advantages and features of the invention will become apparent on examining the detailed description of completely non-limiting embodiments and implementations, and the appended figures, in which.

DETAILED DESCRIPTION OF ILLUSTRATIVE EMBODIMENTS

Figure 1:
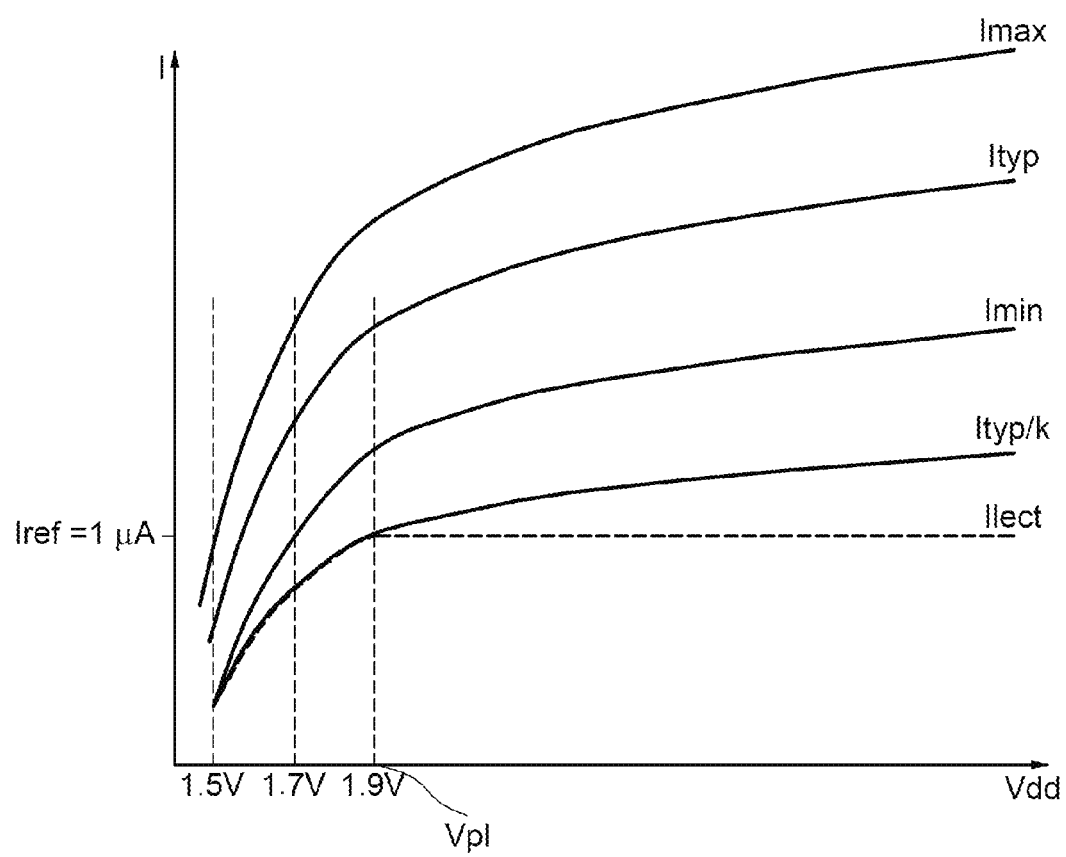
FIGS. 1 to 3 schematically illustrate various implementations and embodiments of the invention.

FIG. 1 is a graph showing the current I flowing through a read path of an electrically erasable and programmable non-volatile memory (EEPROM) as a function of the level of a supply voltage Vdd powering the memory.

The curve Ityp shows the current typically drawn through the read path by a programmed memory cell during its readout.

The curve Imin shows a minimum value of this current. The curve Imax shows a maximum value of this current. The differences between these minimum and maximum values are related to random variations from one transistor to another, in particular due to the processes used to fabricate them.

The curve Ilect shows the value of the read current that is generated by a read amplifier, this current being intended to be injected into the read path in a voltage-based read mode, or intended to be compared to the current passed by the read path in a current-based read mode.

To be functional, the readout requires Ilect<Imin.

The read current Ilect is generated using a method in which the value of the read current is equal to the lowest value between a fraction of the value of a model current Ityp/k representative of an actual current (Ityp, Imin, Imax) able to flow during a readout of a programmed memory cell, relatively to the level of the supply voltage Vdd, and a reference current Iref having a reference value.

In other words, the read current Ilect is controlled so as to be set to a reference value Iref if the supply voltage Vdd is higher than a value floor Vpl, and, if the supply voltage is lower than the value floor Vpl, the read current Ilect is controlled so as to be equal to a fraction of a model current Ityp/k passed by a read path of a memory cell programmed mediocrely and read at this supply voltage Vdd.

The implementation of this method may comprise a step of determining a value of a model current comprising flowing the model current through a model circuit that is controlled by a first voltage, also called the gauge voltage, which voltage is generated on the basis of a comparison of the model current and of the reference current Iref.

The implementation of this method for generating a read current may comprise generating the gauge voltage at a first value, also called the value floor or voltage floor, controlling a flow of a model current equal to the reference value Iref, and, if the supply voltage Vdd is lower than the first value, generating the gauge voltage equal to the supply voltage. The model current being the current flowing through a model circuit that is controlled by the gauge voltage and the read current Ilect being equal to a fraction of the model current.

The read current Ilect is therefore equal to the lowest value between the reference current Iref and a fraction of the typical current Ityp/k, relatively to the level of the supply voltage Vdd, to which level the magnitude of the typical current Ityp is related. The denominator k must be high enough that Ityp/k<Imin, and must be low enough to prevent excessive limitation of the current, which would affect access time—for example 1≤k≤4, and preferably k=2 or k=3.

Thus, as may be seen from FIG. 1, this method allows a correct readout of a not very conductive memory cell following the profile of the curve Imin (for example because of fabrication tolerances or because it is poorly programmed), at a low supply voltage of 1.5 V, whereas conventional methods would produce an erroneous readout below 1.7 V.

Figure 2:
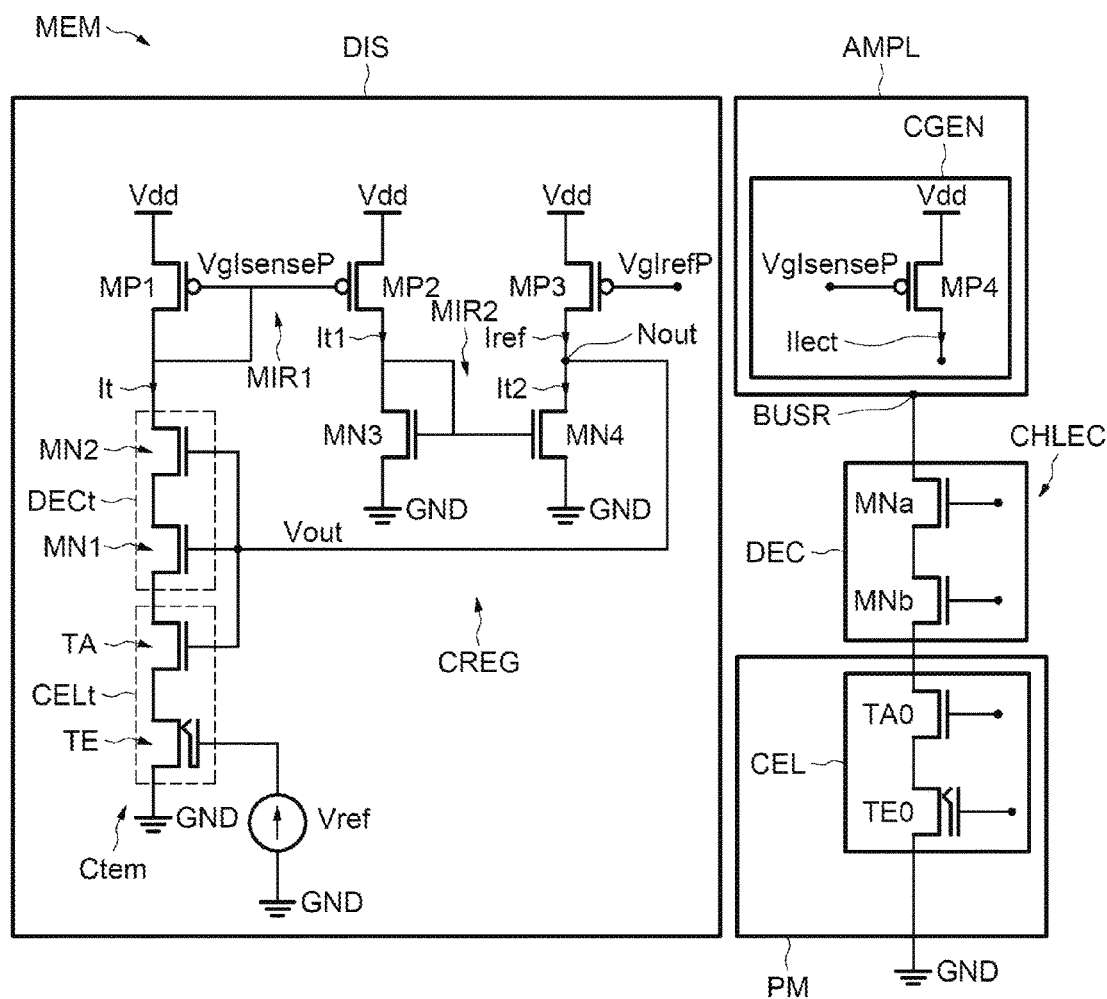

FIG. 2 shows an example of a memory MEM that is an electrically erasable and programmable non-volatile memory (i.e. an EEPROM).

The memory MEM is configured to receive a supply voltage Vdd originating from an external power source ALM, which is redistributed to the elements that it includes.

The memory MEM includes, as is conventional, a memory plane PM equipped with memory cells CEL that are intended to store digital data.

Also as is conventional, the memory MEM includes at least one read amplifier AMPL that is, for example, able to implement voltage- or current-based readouts of the data stored in the memory plane PM. The readouts are respectively implemented by injecting or comparing a read current that is generated by a read-current-generating circuit CGEN that is controlled by a dedicated control voltage (VgIsenseP).

A memory cell CEL includes an access transistor TAo allowing, in the memory plane, the cell to be selected and a floating-gate state transistor TEo allowing a digital datum to be physically stored.

A memory cell CEL belongs to a bit line connecting the memory cell CEL on the one hand to a read input BUSR of the read amplifier AMPL, via a decoding circuit DEC, and on the other hand to a source line that is generally coupled to ground GND during a readout.

A decoding circuit DEC includes, in this example, two transistors, called decoding switches MNa, MNb, allowing the bit line of the memory cell CEL to be read to be connected to a read input BUSR of the read amplifier AMPL.

The element formed by a decoding circuit DEC and a memory cell CEL between the read input BUSR and ground GND forms a read path CHLEC of the memory MEM.

The decoding switches MNa, MNb and the access transistor TAo are nMOS devices and are very resistant when a low voltage is applied to their gates—they behave like switches.

In normal memory operation, these transistors MNa, MNb, TAo are turned on by applying the supply voltage Vdd to their gates.

However, for a given memory MEM, the supply voltage may for example vary depending on the operating conditions (such as the state of charge of a power source ALM consisting of a battery or temperature), or depending on the use for which the memory is intended (such as the clock frequency of a data bus to which the memory is connected). Thus, under low-voltage-level supply conditions, the control of the decoding transistors MNa, MNb and the access transistor TAo may result in an erroneous readout of a datum stored in a programmed memory cell.

The memory MEM advantageously includes, for this reason, a device/circuit DIS for controlling the level of the read current, allowing this problem to be mitigated.

The device DIS is configured to: determine a value of a model current It representative of an actual current able to flow during a readout through a read path CHLEC of the memory MEM, depending on the value of the supply voltage Vdd; compare the model current It with a reference current Iref having a reference value; and generate a control signal VgIsenseP that is intended to control at least one read-current-generating circuit CGEN that is configured to generate, in the presence of the control signal VgIsenseP, a read current Ilect at a value equal to the lowest value between a fraction of the value of the model current (It) and the value of the reference current Iref.

The device DIS comprises a model circuit Ctem that is configured to pass the model current It in a way controlled by a first voltage Vout, and a regulating circuit CREG that is configured to generate the first voltage Vout on the basis of the comparison of the model current It and the reference current Iref.

The model circuit Ctem includes a model decoding circuit DECt and a model memory cell CELL which are connected in series and configured to reproduce the behavior of a read path CHLEC of the memory MEM under the conditions of readout, and relatively to the level of the supply voltage Vdd via the first voltage Vout.

The device DIS allows a model current It representative of the minimum read current Ilect that is to be detected or to be injected into a bit line, relatively to the level of the supply voltage Vdd, to be measured.

The model circuit Ctem is configured to pass a model current It controlled by the gauge voltage Vout, and the regulating circuit CREG is configured to generate the gauge voltage Vout depending on the model current It with respect to a reference current Iref, and depending on the level of the supply voltage Vdd.

In this example, the model decoding circuit DECt includes two nMOS transistors, called model decoding switches MN1, MN2, of architectures homologous to the architectures of the decoding switches MNa, MNb of the memory MEM.

The expression "of architecture homologous" is understood here and below to mean that the elements in question are fabricated in the same fabrication process and using the same parameters such as their sizes, their dopant concentrations, the materials from which they are made, etc.

The model decoding switches MN1, MN2 are controlled via their gates by the gauge voltage Vout.

The model memory cell CELt comprises a model access transistor TA and a model state transistor TE of architectures homologous to the respective architectures of the access transistor TAo and state transistor TEo of a memory cell CEL of the memory plane PM.

The model access transistor TA is configured to be controlled by the gauge voltage Vout.

The model state transistor TE includes a floating gate to which a dedicated control voltage Vref, i.e., a reference voltage Vref that is generated by an external voltage source, is applied. The reference voltage Vref is of value equal to the voltage present on the floating gate of a mediocrely programmed state transistor TEo and under the normal conditions of readout of the memory.

The value of the reference voltage Vref may be obtained by elementary calculations of the capacitive coupling between the control-gate, drain and floating-gate potentials of the model state transistor TE. In some embodiments, for example, the reference voltage may be substantially 1.2 V.

More generally, the model state transistor TE is configured to be turned on by a voltage close to its threshold voltage. In some embodiments, by "close to," what is meant is different by at most 0.2 V.

The model state transistor TE may include a floating gate and a control gate that are electrically connected to each other. The reference voltage Vref may thus be applied via a conventional control-gate connection.

Thus, the model state transistor TE is configured to have the behavior of a mediocrely programmed state transistor, and the flow of current through the read path is representative of the flow of a current through a poorly programmed memory cell of the memory plane during its readout.

Furthermore, the read amplifier AMPL includes a regulating circuit CREG that is configured to generate the gauge voltage Vout depending on the model current It and on the level of the supply voltage Vdd.

The regulating circuit CREG includes at least one current mirror that is configured to extract, from an output node Nout, a copy of the model current It.

For example, the regulating circuit CREG includes a first current mirror MIR1 and a second current mirror MIR2.

In this example, the first current mirror MIR1 is of conventional design and includes a pMOS first transistor MP1, the source of which is connected to a supply-voltage terminal Vdd and the drain of which is connected to the model read path CHLECt, the drain of the first transistor MP1 being connected to its gate, and a pMOS second transistor MP2, the gate of which is connected to the gate of the first transistor MP1 and the source of which is connected to a supply-voltage terminal Vdd.

Thus, in this example, the first current mirror MIR1 is configured so that the drain current It1 of the second transistor MP2 is equal to the drain current It of the first transistor MP1.

The value of the mirror control voltage VglsenseP present on the common gates of the first and second transistors MP1, MP2, may thus control a pMOS transistor that is homologous to the first transistor MP1 in order to make a current equal to the model current It flow.

The regulating circuit CREG includes, in this example, a second conventional current mirror MIR2 including an nMOS third transistor MN3, the source of which is connected to a ground terminal GND and the drain of which is connected to the drain of the second transistor MP2, the drain of the third transistor MN3 being connected to its gate, and an nMOS fourth transistor MN4, the gate of which is connected to the gate of the third transistor MN3 and the source of which is connected to a ground terminal GND.

Thus, the second current mirror MIR2 is configured so that the drain current It2 of the fourth transistor MN4 is equal to the drain current It1 of the third transistor MN3.

Moreover, the drain of the fourth transistor MN4 is connected to an output node Nout into which a constant-value reference current Iref that is generated by a reference-current generator is injected.

For example, a pMOS fifth transistor MP3, the source of which is connected to a supply-voltage terminal Vdd, the drain of which is connected to the output node Nout and which is controlled, via its gate, by a reference-current-generating control voltage VglrefP, allows such a reference-current generator to be formed.

In other words, the first current mirror MIR1 and the second current mirror MIR2 allow, from the output node Nout, a current It2, here equal to the model current It, to be extracted whereas a reference-current generator is configured to inject a reference current Iref into the output node Nout.

The gauge voltage Vout is the voltage present on the output node Nout. The set of current flows injected and extracted from the output node reaches equilibrium and a gauge voltage Vout of stable value, called the value floor or voltage floor (Vpl with reference to FIG. 1), is thereby generated.

Specifically, the model current It flowing through the model circuit Ctem is in particular controlled by the gauge voltage Vout applied to the gates of the model access transistor TA and of the model decoding switches MN1, MN2. Therefore, the value of the model current It increases with the value of the gauge voltage Vout. The gauge voltage Vout may have a value comprised between ground voltage GND and the supply voltage Vdd. The minimum value of the gauge voltage Vout is in practice equal to the greatest of the threshold voltages of the transistors the gate of which receives the gauge voltage Vout, in the present case the access transistor TA and the model decoding transistors MN1, MN2.

In the case where the supply voltage Vdd is higher than the value floor:

If the gauge voltage Vout is equal to the supply voltage Vdd, the model current It is maximal, and the current extracted from the output node Nout by the fourth transistor MN4 is higher than the reference current Iref, this tending to lower the voltage Vout towards ground GND.

If the gauge voltage Vout is equal to ground GND, the model current It is zero, since no current flows through MN4, and the injection of the reference current Iref into the output node Nout will tend to make the gauge voltage Vout increase towards the supply voltage Vdd.

An equilibrium is reached, the gauge voltage Vout stabilizes to the value floor located between the supply voltage Vdd and the threshold voltages of the model access transistor TA and of the model decoding switches MN1, MN2.

The value floor of the gauge voltage Vout is such that the model current It that flows through the model circuit Ctem is equal to the reference current Iref.

Thus, the value of the mirror control voltage VgIsenseP here corresponds to the voltage controlling a flow of a current equal to the reference current Iref through a pMOS transistor that is homologous to the first transistor MP1.

In the case where the supply voltage Vdd is lower than the value floor:

When Vdd drops below the value floor, the gauge voltage Vout can no longer reach equilibrium. The gauge voltage Vout becomes substantially equal to the supply voltage Vdd, and the model current It passed by the model circuit Ctem becomes dependent on the supply voltage Vdd, instead of being equal to the reference current Iref.

Thus, the value of the mirror control voltage VgIsenseP here corresponds to the voltage controlling the flow of a current equal to the current flowing through a bit line of a poorly programmed memory cell and through a pMOS transistor that is homologous to the first transistor MP1.

In both cases, the mirror control voltage VgIsenseP is used in the read amplifier AMPL to generate the read current Ilect.

The read current Ilect thus generated is intended to be injected into the bit line of a memory cell read in a voltage-based read mode, or intended to be compared to a current flowing through the bit line of a memory cell read in a current-based read mode.

A mirror control voltage VgIsenseP generated by a single device DIS for controlling the level of the read current may be distributed to a plurality of read amplifiers AMPL of the memory MEM, each having a read-current-generating circuit CGEN. For example, a control signal VgIsenseP generated by a single device DIS for controlling the level of the read current may be distributed to four to sixteen and preferably eight read amplifiers AMPL.

In this example, the read-current-generating circuit CGEN includes a pMOS transistor MP4 that is homologous to the first transistor MP1 and the source of which is connected to a supply-voltage terminal Vdd.

The read-current generator MP4 is controlled by the mirror control voltage VgIsenseP and thus allows the read current Ilect to be generated on its drain.

The read amplifier AMPL furthermore includes a circuit that allows a measurement carried out on the input BUSR, which is representative of the programmed or erased state of the memory cell read in the memory plane PM, to be converted into a digital signal. This circuit is not shown here, and may be configured in conventional and known configurations for performing voltage- and/or current-based readouts.

Figure 3:
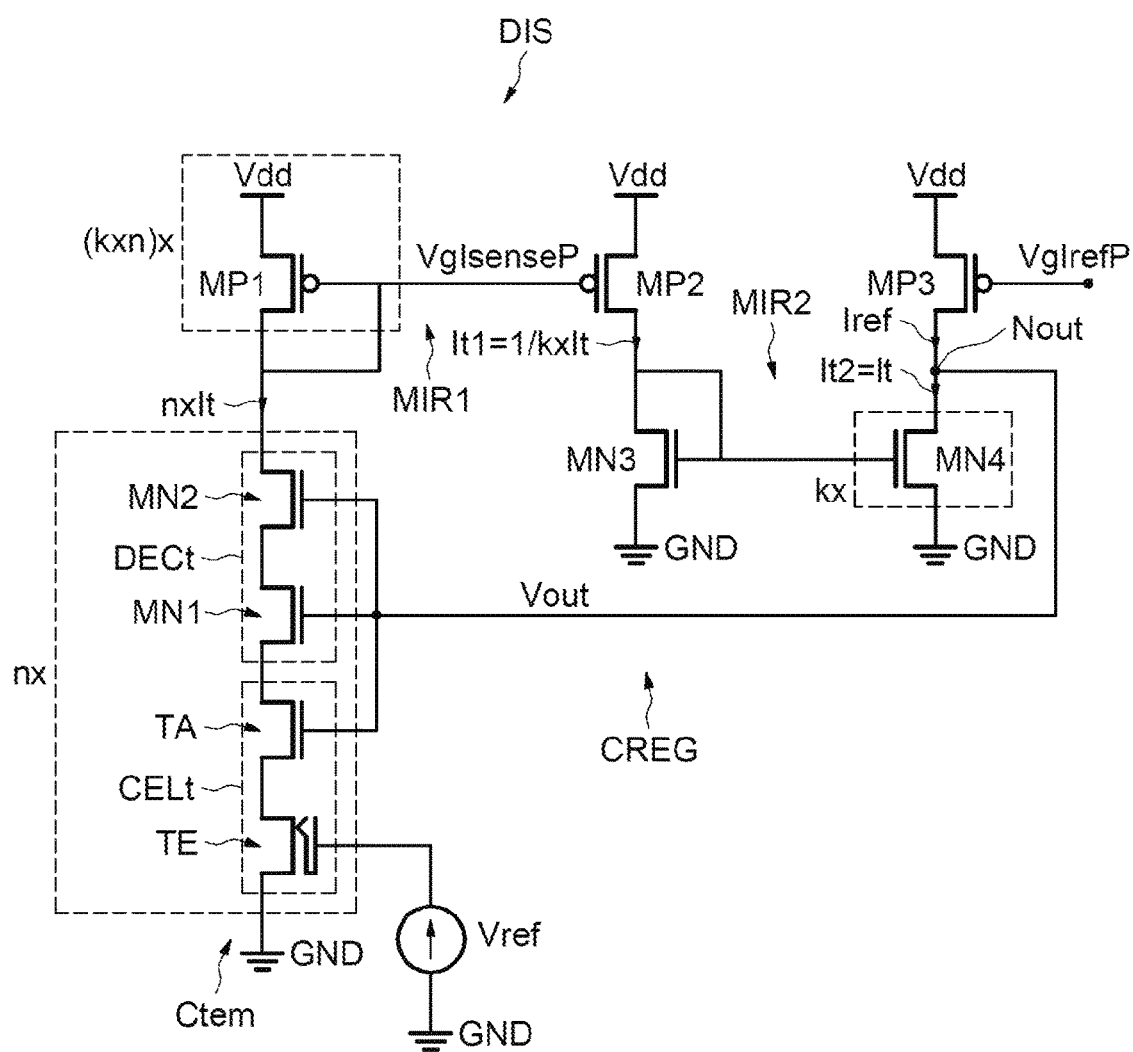

FIG. 3 shows a preferred embodiment of the model circuit Ctem and of the regulating circuit CREG.

In order to counteract random variations related to the fabrication processes between transistors, a number n of model read paths, each including a model decoding circuit DECt in series with a model memory cell CELt, are produced in parallel.

Therefore, for a given supply voltage Vout, the drain current of the first transistor MP1 of the first current mirror MIR1 will be equal to n×It (with It the current passed by a model read path DECt, CELt).

To determine the right value of the mirror control voltage VgIsenseP, the first current mirror MIR1 also includes n first transistors MP1 in parallel.

Furthermore, to obtain a read current equal to a fraction of denominator k of the model current It, such as introduced above with reference to FIG. 1, k×n first transistors MP1 are then produced in parallel.

The mirror control voltage VgIsenseP is thus representative of 1/k th of the model current It flowing on average through one of the n model read paths.

This being so, to prevent, when the supply voltage is higher than the value floor (the gauge voltage Vout then being obtained via the equilibrium described above with reference to FIG. 2) the mirror control voltage VgIsenseP from being representative of (1/k)×Tref, in the second current mirror MIR2, k fourth transistors MN4 are produced, in order to extract k times the current It1=Iref/k issued from the first current mirror MIR1, i.e. a current It2=It, from the output node Nout.

The higher the number n, the more statistically reliable the generation of the model current It is with respect to the memory cells CEL of the memory plane PM.

For example n=10 and 1≤k≤4 and preferably k=2 or k=3.

Advantages of some embodiments include allowing for proper read operation at lower supply voltages without compromising access time and power consumption at high voltages.

Furthermore, the invention is not limited to these embodiments and encompasses any variant thereof.

What is claimed is:

1. A circuit for controlling a level of a read current of a non-volatile memory that is configured to be powered by a supply voltage, the circuit comprising:
a model circuit configured to determine a value of a model current representative of an actual current able to flow during a readout through a read path of the non-volatile memory, depending on the value of the supply voltage; and
a regulating circuit configured to:
compare the model current with a reference current having a reference value, and
generate a control signal that is configured to control a read-current-generating circuit that is configured to generate, in the presence of the control signal, the read current with a value equal to a lowest value between a fraction of a value of the model current and the reference value, wherein the model circuit is configured to pass the model current in a way that is controlled by a first voltage, and the regulating circuit is configured to generate the first voltage based on comparing the model current with the reference current, and wherein the regulating circuit is configured to generate the first voltage equal to a voltage floor when the supply voltage is higher than or equal to the voltage floor and equal to the supply voltage when the supply voltage is lower than the voltage floor, the voltage floor having a value resulting from controlling the model current based on the reference value.

2. The circuit of claim 1, wherein the regulating circuit comprises:
a current mirror that is configured to extract, from an output node, a copy of the model current; and
a reference-current generator that is configured to inject, into the output node, the reference current, the first voltage being a resulting voltage on the output node.

3. The circuit of claim 2, wherein the control signal is a mirror control voltage present on common gates of two transistors of the current mirror.

4. A circuit for controlling a level of a read current of a non-volatile memory that is configured to be powered by a supply voltage, the circuit comprising:
a model circuit configured to determine a value of a model current representative of an actual current able to flow during a readout through a read path of the non-volatile memory, depending on the value of the supply voltage; and
a regulating circuit configured to:
compare the model current with a reference current having a reference value, and
generate a control signal that is configured to control a read-current-generating circuit that is configured to generate, in the presence of the control signal, the read current with a value equal to a lowest value between a fraction of a value of the model current and the reference value, wherein the model circuit is configured to pass the model current in a way that is controlled by a first voltage, and the regulating circuit is configured to generate the first voltage based on comparing the model current with the reference current, and wherein the non-volatile memory comprises memory cells, each memory cell of the non-volatile memory comprising an access transistor and a state transistor having a threshold voltage, wherein the model circuit comprises a model memory cell of architecture homologous to an architecture of a memory cell of the non-volatile memory, a model access transistor of the model memory cell being configured to be controlled via a gate of the model access transistor by the first voltage, and a model state transistor of the model memory cell being configured to be turned on by a dedicated control voltage.

5. The circuit of claim 4, wherein the dedicated control voltage is within 0.2 V of a threshold voltage of the model state transistor.

6. The circuit of claim 4, wherein the model state transistor comprises a floating gate and a control gate that are electrically connected to each other.

7. A circuit for controlling a level of a read current of a non-volatile memory that is configured to be powered by a supply voltage, the circuit comprising:
a model circuit configured to determine a value of a model current representative of an actual current able to flow during a readout through a read path of the non-volatile memory, depending on the value of the supply voltage; and
a regulating circuit configured to:
compare the model current with a reference current having a reference value, and
generate a control signal that is configured to control a read-current-generating circuit that is configured to generate, in the presence of the control signal, the read current with a value equal to a lowest value between a fraction of a value of the model current and the reference value, wherein the model circuit is configured to pass the model current in a way that is controlled by a first voltage, and the regulating circuit is configured to generate the first voltage based on comparing the model current with the reference current, and wherein the model circuit comprises a model decoding circuit comprising a model decoding switch of architecture homologous to an architecture of decoding switches of the non-volatile memory allowing a bit line to be electrically connected to a read input of a read amplifier, the model decoding switch being configured to be controlled by the first voltage.

8. The circuit of claim 7, wherein the model circuit comprises a model memory cell of architecture homologous to an architecture of a memory cell of the non-volatile memory, and wherein the model decoding circuit and the model memory cell are respectively connected in series.

9. The circuit of claim 1, wherein the fraction of the value of the model current is between $1/4$ and $1/1$ of the model current.

10. The circuit of claim 1, wherein the read current is configured to be injected into a bit line of the non-volatile memory for a voltage-based readout.

11. The circuit of claim 1, wherein the read current is configured to be compared to a current flowing through a bit line of the non-volatile memory for a current-based readout.

12. A non-volatile memory of the electrically erasable and programmable non-volatile memory type, the non-volatile memory comprising:
a memory cell; and
a circuit configured to:
determine a value of a model current representative of an actual current able to flow during a readout through a read path of the non-volatile memory, depending on a value of a supply voltage, wherein the read path is coupled to the memory cell,
compare the model current with a reference current having a reference value, and
generate a control signal that is configured to control a read-current-generating circuit that is configured to generate, in the presence of the control signal, the read current with a value equal to a lowest value between a fraction of a value of the model current and the reference value; and
a read amplifier comprising a controllable read-current-generating circuit, the read-current-generating circuit being configured to deliver the control signal to the read-current-generating circuit, wherein determining the model current comprises passing the model current through a model circuit that is controlled by a first voltage that is generated based on comparing the model current and the reference current, and wherein the first voltage is equal to a voltage floor if the supply voltage is higher than or equal to the voltage floor and equal to the supply voltage if the supply voltage is lower than the voltage floor, the voltage floor having a value resulting from controlling the model current based on the reference value.

13. The non-volatile memory of claim 12, further comprising an access transistor configured to be controlled by the supply voltage, and a state transistor having a threshold voltage that is configured to be turned on by a dedicated control voltage close to the threshold voltage.

14. The non-volatile memory of claim 12, wherein the model circuit comprises a model decoding circuit comprising a model decoding switch of architecture homologous to an architecture of decoding switches of the non-volatile memory allowing a bit line to be electrically connected to a read input of a read amplifier, the model decoding switch being configured to be controlled by the first voltage.

15. The non-volatile memory of claim 14, wherein the model circuit comprises a model memory cell of architecture homologous to an architecture of a memory cell of the non-volatile memory, and wherein the model decoding circuit and the model memory cell are respectively connected in series.

16. A method for controlling a level of a read current in a non-volatile memory that is powered by a supply voltage, the method comprising:
    determining a model current representative of an actual current able to flow during a readout through a read path of the non-volatile memory, based on a value of the supply voltage;
    comparing the model current and a reference current having a reference value; and
    generating a control signal controlling a generation of the read current, the read current having a level equal to a lowest value between a fraction of the value of the model current and the value of the reference current, wherein the non-volatile memory comprises a memory cell equipped with an access transistor that is controlled by the supply voltage, and a state transistor having a threshold voltage turned on by a dedicated control voltage close to the threshold voltage.

17. The method of claim 16, wherein determining the model current comprises passing the model current through a model circuit that is controlled by a first voltage that is generated based on comparing the model current and the reference current.

18. The method of claim 17, wherein the first voltage is equal to a voltage floor if the supply voltage is higher than or equal to the voltage floor and equal to the supply voltage if the supply voltage is lower than the voltage floor, the voltage floor having a value resulting from controlling the model current based on the reference value.

19. The method of claim 17, further comprises generating the first voltage by copying the model current so as to extract, from an output node, the copied model current and injecting, into the output node, the reference current, the first voltage being a resulting voltage on the output node.

20. The method of claim 16, wherein the dedicated control voltage is within 0.2 V of the threshold voltage.

21. The method of claim 20, further comprising applying the dedicated control voltage to a floating gate of the state transistor.

22. The method of claim 16, wherein the non-volatile memory comprises a decoding switch that is controlled by the supply voltage.

23. The method of claim 16, wherein the fraction of the value of the model current is between 1/4 and 1/1 of the model current.

24. The method of claim 16, wherein, during a readout, the read current is injected into a bit line of the non-volatile memory for a voltage-based readout.

25. The method of claim 16, wherein, during a readout, the read current is compared to a current flowing through a bit line of the non-volatile memory for a current-based readout.

* * * * *